US007800799B2

(12) United States Patent
Kitao

(10) Patent No.: US 7,800,799 B2
(45) Date of Patent: Sep. 21, 2010

(54) COLOR SHIFT CORRECTING APPARATUS AND METHOD, IMAGE FORMING APPARATUS, COLOR SHIFT CORRECTING PROGRAM AND RECORDING MEDIUM

(75) Inventor: Katsuyuki Kitao, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 1051 days.

(21) Appl. No.: 11/514,893

(22) Filed: Sep. 5, 2006

(65) Prior Publication Data

US 2007/0053024 A1 Mar. 8, 2007

(30) Foreign Application Priority Data

Sep. 7, 2005 (JP) ............................ 2005-259772
Aug. 1, 2006 (JP) ............................ 2006-210408

(51) Int. Cl.
*G03F 3/08* (2006.01)

(52) U.S. Cl. ........................ 358/518; 358/1.9; 358/504; 399/301; 399/39; 399/40; 399/299; 399/302

(58) Field of Classification Search ...................... None
See application file for complete search history.

(56) References Cited

U.S. PATENT DOCUMENTS 6,148,168 A * 11/2000 Hirai et al. .................. 399/301
6,408,156 B1 * 6/2002 Miyazaki et al. ............ 399/301
6,622,101 B1 * 9/2003 Oechsner et al. .............. 702/84
7,360,886 B2 * 4/2008 Kitao ......................... 347/103
7,417,652 B2 * 8/2008 Yamazaki ................... 347/116
2004/0257600 A1 * 12/2004 Hiromatsu .................. 358/1.9
2005/0094895 A1 * 5/2005 Baron ........................ 382/275
2005/0117917 A1 * 6/2005 Lee et al. ....................... 399/1
2005/0195235 A1 9/2005 Kitao
2006/0164506 A1 7/2006 Kitao
2006/0170754 A1 8/2006 Kitao
2006/0182472 A1 * 8/2006 Munakata et al. ........... 399/299

FOREIGN PATENT DOCUMENTS

JP 63-286865 11/1988
JP 8-305110 11/1996
JP 3327299 7/2002
JP 3548239 4/2004

* cited by examiner

*Primary Examiner*—Mark K Zimmerman
*Assistant Examiner*—Javier J Ramos
(74) *Attorney, Agent, or Firm*—Oblon, Spivak, McClelland, Maier & Neustadt, L.L.P.

(57) ABSTRACT

A color shift detection pattern forming part forms a color shift detection pattern. A sensor detects color shift in the color shift detection pattern. A color shift amount computing part calculates an amount of color shift. A color shift correcting part corrects the calculated amount of color shift. A correction amount computing part computes an amount of correction to correct the computed amount of color shift. A correcting part corrects the computed amount of color shift based on the computed amount of correction based on a setting value for controlling a color shift state. A determining part determines whether an abnormality is detected in the computed amount of color shift or in the computed amount of correction of color shift based on a result of computation of the amount of color shift or a result of computation of the amount of correction. A fixed value setting part sets a specific fixed value to the setting value of the correcting part.

19 Claims, 12 Drawing Sheets

COLOR SHIFT CORRECTING APPARATUS AND METHOD, IMAGE FORMING APPARATUS, COLOR SHIFT CORRECTING PROGRAM AND RECORDING MEDIUM

BACKGROUND OF THE INVENTION

1. Field of the Invention

The present invention relates to color shift correcting techniques and, more particularly, to a color shift correcting apparatus and method for image forming apparatus to correct color shift in an output image of an image forming apparatus and a color shift correcting program and a recording medium storing a color shift correcting program.

2. Description of the Related Art

Conventionally, in an image forming apparatus for forming an image of a plurality of colors such as a color printer, a color image is formed by overlapping images of different colors such as, for example, magenta, cyan, yellow and black. Accordingly, when so-called color shift occurs due to an offset in positions of images of each color, a color of characters and lines may be changed or image irregularity (color irregularity) may occur, which results in deterioration of image quality. Thus, it is desirous to form a color image by matching positions of images of each color as much as possible.

Especially, in a tandem-type image forming apparatus having a photosensitive member and a write optical system for writing an image on the photosensitive member by a light beams or the like for each color, since color images are formed by different write optical systems and different photosensitive members, it is an important issue to eliminate color shift.

In order to correct color shift, a correction pattern for correcting color shift in an image is formed on a transfer belt so as to detect an amount of color shift of an image by reading the formed correction pattern by an optical sensor. Then, based on the result of the detection, a timing for writing an image on a photosensitive member by a light beam is adjusted or a mirror of an optical system provided in an apparatus is moved and adjusted so as to perform a color shift correction (for example, refer to Patent Documents 1, 2 and 3).

FIG. 1 is an illustration of an example of a color shift detection pattern. As shown in FIG. 1, an amount of color shift is small at a position where a sensor output voltage is low. FIG. 2 is a flowchart of a conventional example of a color shift correcting process. First, a color shirt detection pattern is printed on a belt (step S1). Then, a signal of a sensor (a signal corresponding to the color shift detection pattern) is read (step S2) so as to detect an amount of color shift (step S3).

Here, there is a detectable range of a maximum amount of color shift. If the present amount of color shift is within the detectable range, color shift can be detected normally. However, if an amount of color shift is abnormally large and exceeds the detectable range, or an amount of color shift does not exceed but cannot be detected normally, such a state is rendered to be a color shift amount detection abnormality. Additionally, if an amount of color shift exceeds a correctable range, such a state is rendered to be a correction amount abnormality.

If it is not a color shift amount detection abnormality (N of step S4), and if it is not a correction amount abnormality (N of step S5), a color shift correction is performed normally (step S6). On the other hand, if it is a color shift amount detection abnormality (Y of step S4), or if it is a correction amount abnormality (Y of step S5), an error process if performed conventionally (step S7).

Patent Document 1: Japanese Laid-Open Patent Application No. 6-253151

Patent Document 2: Japanese Laid-Open Patent Application No. 8-85234

Patent Document 3: Japanese Laid-Open Patent Application No. 8-305110

However, according to the image forming apparatuses of a conventional technique disclosed in the above mentioned Patent Documents 1-3, there is a detectable range in which an amount of color shift can be detected. Thus, if an amount of color shift is large and exceeds the detectable range, there is a case where an amount of color shift cannot be detected normally.

In such as case, a color shift correction cannot be performed since an amount of color shift to be corrected is unknown, and the color shift correcting process must be ended abnormally. At this time, the original color shift remains uncorrected. Thus, if the same procedure is repeated, the color shift amount cannot be detected again, and there is a problem in that the color shift correction cannot be performed.

Moreover, there is a correctable range in an amount of correction of color shift. Thus, even if the color shift amount in an image can be detected, there is a case where an amount of correction is too large due to a large amount of color shift and exceeds the correctable range. Also in such a case, there may be a case where an amount of correction is too large due to a large amount of color shift and exceeds the correctable range. In this case, the color shift correcting process must be ended abnormally as well as the above mentioned case, and there is a problem in that a color shift correction cannot be performed.

SUMMARY OF THE INVENTION

It is a general object of the present invention to provide a novel and useful color shift correcting method and apparatus in which the above mentioned problems are eliminated.

A more specific object of the present invention is to provide a color shift correcting method and apparatus and an image forming apparatus, which can achieve an accurate color shift correction even when an amount of color shift in an image is abnormally large such that it exceeds a detectable range or a correctable range.

In order to achieve the above-mentioned objects, there is provided according to one aspect of the present invention a color shift correcting apparatus comprising: a color shift detection pattern forming part that forms a color shift detection pattern; a sensor that detects color shift in the color shift detection pattern; a color shift amount computing part that calculates an amount of color shift; a color shift correcting part that corrects the calculated amount of color shift; a correction amount computing part that computes an amount of correction to correct the computed amount of color shift; a correcting part that corrects the computed amount of color shift based on the computed amount of correction based on a setting value for controlling a color shift state; a determining part that determines whether an abnormality is detected in the computed amount of color shift or in the computed amount of correction of color shift based on a result of computation of the amount of color shift or a result of computation of the amount of correction; and a fixed value setting part that sets a specific fixed value to the setting value of the correcting part.

The color shift correcting apparatus according to the present invention includes the color shift detection pattern printing part, the sensor for detecting the color shift detection pattern, the color shift amount computing part, the determining part for determining a color shift amount detection abnormality and a correction amount abnormality based on a color shift amount detection result and a correction amount, and the color shift correcting part, and the color shift correcting apparatus further includes the fixed value setting part that sets a setting value for controlling a color shift state of the color shift correcting part to a specific fixed value. Thus, even when the color shift amount detection abnormality or the correction amount abnormality occurs, the color shift can be returned to a correctable state.

In the color shift correcting apparatus according to the present invention, the fixed value may be a correction value previously obtained at a time of adjustment in manufacturing. The fixed value may be a statistical mean value of correction values obtained at a time of adjustment in manufacturing. The fixed value may be a statistical mean value of correction values obtained from a plurality of apparatuses at a time of adjustment in manufacturing.

The color shift correcting apparatus according to the present invention may further comprise a control part that detects color shift again by using the specific fixed value after the abnormality is detected, and return the setting value to an initial setting value when an occurrence of the abnormality is detected by the determining part again. The fixed value may be changed by a setting operation through an operation part of the color shift correcting apparatus. The setting value may be at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification error deviation adjustment value and a bow shift adjustment value.

There is provided according to another aspect of the present invention a color shift correcting method comprising: reading a color detection pattern; computing an amount of color shift based on a result of the reading of the color detection pattern; determining whether the computed amount of color shift is correctable; correcting the color shift when the computed amount of color shift is correctable; and setting a specific fixed value to a setting value for controlling a color shift state when the computed amount of color shift is not correctable.

In the color shift correcting method according to the present invention, the determination of correctability may include detection of an abnormality in an amount of color shift or an abnormality in an amount of correction.

Additionally, there is provided according to another aspect of the present invention an image forming apparatus comprising: a pattern formation part that forms a correction pattern of each of a plurality of colors on a transfer belt so as to correct color shift in an image; a detection part that detects an amount of color shift in the correction pattern formed by the pattern formation part; a judgment part that judges whether or not a setting value for controlling a color shift state of the correction pattern is needed to be changed base on the amount of color shift detected by the detection part; and a setting value change part that changes, when the judgment part judges that a change is needed, the setting value for controlling a color shift state of the correction pattern when forming the correction pattern by the pattern formation part to a specific setting value.

In the image forming apparatus according to the present invention, when the detection part detects an amount of color shift equal to or grater than a predetermined threshold value, the judgment part may judge that the setting value for controlling a color shift of the correction pattern is needed to be changed. When the detection part does not detect an amount of color shift, the judgment part may judge that the setting value for controlling a color shift of the correction pattern is needed to be changed.

The image forming apparatus according to the present invention may further comprise a correction part that corrects a color shift in the correction pattern formed by the pattern formation part based on an amount of the color shift detected by the detection part, and wherein when the setting value for controlling a color state was changed to the specific setting value by the setting value change part, the pattern formation part forms a correction pattern on the transfer belt, based on the specific setting value. When a correction to an amount of color shift detected by the detection part exceeds a correctable range in which the correction can be performed by the correction part, the judgment part may judge that the setting value for controlling a color shift state of the correction pattern in needed to be changed. The specific setting value may be a value having the same absolute value as a correction value in an immediately preceding correction with a plus-minus sign reversed from that of the correction value. The specific setting value may be computed based on an absolute value of a maximum amount of color shift in a correction performed by the correction part for a plurality of times and having a plus-minus sign reversed from that of the maximum amount of color shift.

In the image forming apparatus according to the present invention, the specific setting value may be computed base on a setting value at a time of factory adjustment and a difference between present measurement values and measurement values of parameters indicating a state of an environment including a temperature and humidity. The setting value for controlling a color shift state of the correction pattern may be at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification fluctuation adjustment value and a bow shift adjustment value.

Further, there is provided according to another aspect of the present invention a color shift correcting method comprising: a first pattern forming step of forming a correction pattern of each of a plurality of colors on a transfer belt so as to correct color shift in an image; a first detecting step of detecting an amount of color shift in the correction pattern formed by the pattern forming step; a judging step of judging whether or not a setting value for controlling a color shift state of the correction pattern is needed to be changed base on the amount of color shift detected by the detecting step; a setting value changing step of changing, when the judging step part judges that a change is needed, the setting value for controlling a color shift state of the correction pattern when forming the correction pattern by the first pattern forming step to a specific setting value; a second pattern forming step of forming another correction pattern on the transfer belt based on the specific setting value when the setting value for controlling a color shift state has been changed by the setting value changing step; a second detecting step of detecting an amount of color shift in the another correction pattern formed by the second pattern forming step; and a correcting step of correcting the color shift in the another correction pattern formed by the second pattern forming step based on the amount color shift detected by the second detecting step.

There is provided according to another aspect of the present invention a computer readable recording medium storing a program for causing a computer to perform the above-mentioned color shift correcting method.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments of the present invention.

Figure 3:
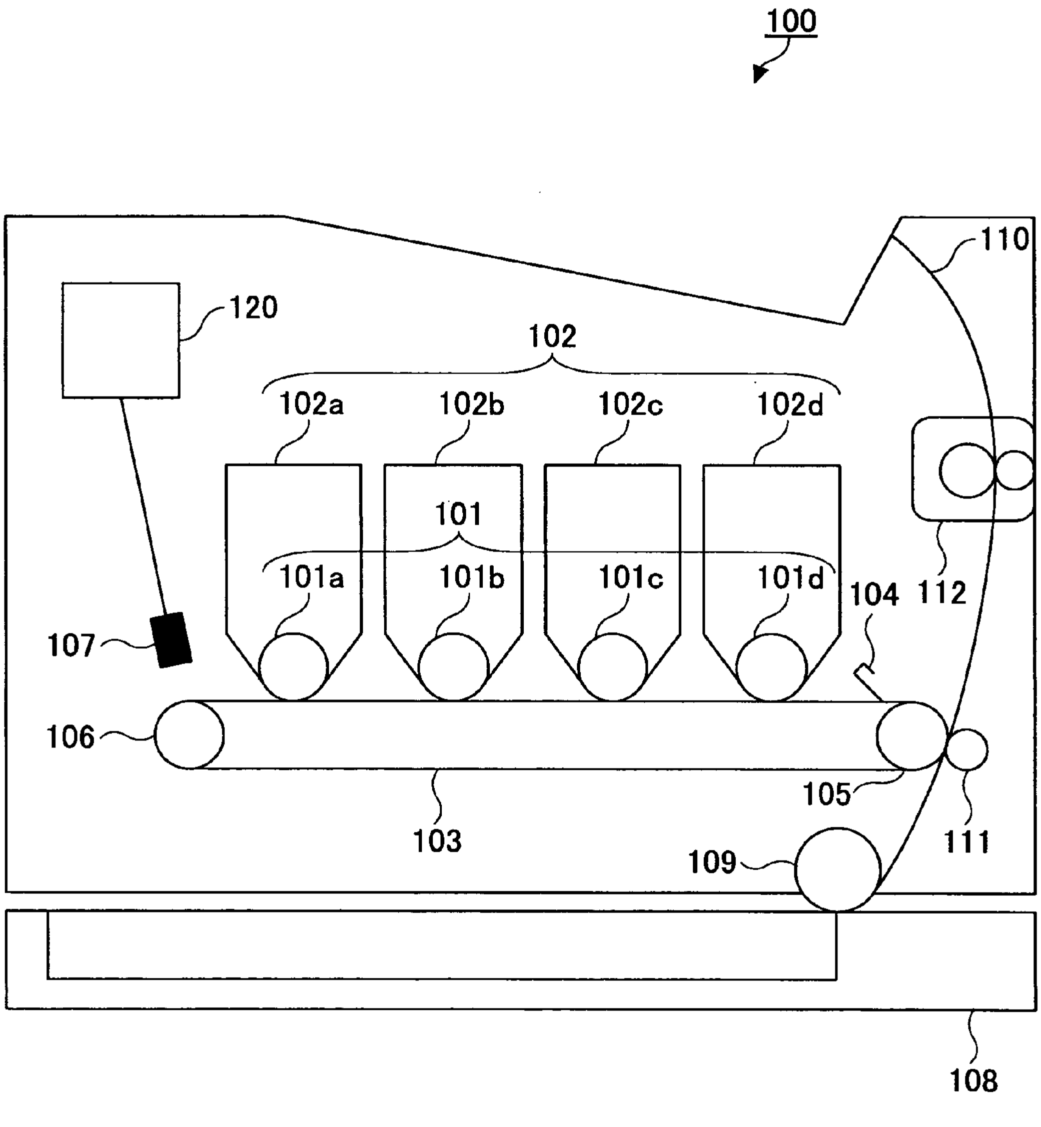
FIG. 3 is an illustration of a color printer according an embodiment of the present invention.

First, a description will be given of a color printer, which is an example of an image forming apparatus according to an embodiment of the present invention. FIG. 3 is an illustration of an entire structure of a color printer according to an embodiment of the present invention. The color printer 100 comprises a photosensitive member 101, a development unit 102, an intermediate transfer belt 103, a cleaning unit 104, a drive roller 105, a tension roller 106, a sensor 107, a paper feed cassette 108, a paper feed roller 109, a conveyance path 110, a secondary transfer roller 111, and a fixing unit 112.

The surface of the photosensitive member 101 is charged in a uniform negative electric charge by a charge unit, which is not illustrated. An electrostatic latent image is formed on the surface of the photosensitive member 101 by irradiating a laser beam onto the surface of the photosensitive member 101 by an exposure unit, which is not illustrated.

The development unit 102 develops the electrostatic latent image formed on the surface of the photosensitive member 101 by causing a charged toner to adhere thereon. Thereby, a toner image of each toner color is formed on the surface of the photosensitive member 101.

It should be noted that the exposure unit, which is not illustrated, the photosensitive member 101 and the development unit 102 are provided for each of four color toners, which are cyan, magenta, yellow and black. Specifically, the development unit 102*a* develops the electrostatic latent image formed on the surface of the photosensitive member 101*a* by causing a charged cyan toner to adhere thereon. Similarly, the development units 102*b*, 102*c* and 102*d* form magenta, yellow and black toner images on the respective photosensitive members 101*b*, 101*c* and 101*d*.

The toner image formed on the surface of the photosensitive member 101 is transferred onto the intermediate transfer belt 103 at a position (a primary transfer position) where the photosensitive member 101 and the intermediate transfer belt 103 contacts with each other by an action of the primary transfer roller. According to this transfer, a toner image of four colors, which are cyan, magenta, yellow and black, is formed on the intermediate transfer belt 103 by sequentially transferring the toner images formed on the respective photosensitive members 101*a*, 101*b*, 101*c* and 101*d*. The toner remaining on the surface of each of the photosensitive members 101*a*, 101*b*, 101*c* and 101*d* is cleaned by a cleaning unit 104, and the each of the photosensitive members 101*a*, 101*b*, 101*c* and 101*d* waits for a next image formation.

The intermediate transfer belt 103 rotates in association with rotation of the drive roller 105. The tension roller 106 takes up the slack of the intermediate transfer belt 103 so as to achieve a smooth rotation of the intermediate transfer belt 103.

The sensor 107 reads toner images such as a correction pattern formed on the intermediate transfer belt 103. Specifically, the sensor 107 is constituted by, for example, a photodiode and read a toner image by irradiating a light onto the toner image transferred on the intermediate transfer belt 103 and receiving the light reflected by the intermediate transfer belt 103.

Recording papers for printing by the color printer 100 are set in the paper feed cassette 108. The recording papers set in the paper feed cassette 108 are conveyed to the conveyance path 110 in association with rotation of the paper feed roller 109.

The secondary transfer roller 111 transfers a toner image formed on the intermediate transfer belt 103 onto the recording paper by applying a pressure to the recording paper conveyed from the paper feed cassette 108 by the paper feed roller 109. The fixing unit 112 fixes the toner image on the recording paper by fusing the toner image on the recording paper. The recording paper, on which the toner image is fixed in the fixing unit 112, is ejected to outside the color printer 100 as a result of printing.

It should be noted that the above-mentioned sensor 107 is connected to a controller 120 (a control part), which is constituted by a known electronic parts such as a CPU, a ROM, a RAM or the like, so that the reading operation of the sensor 107 is controlled by the controller 120. The controller 120 also controls color shift detection, calculation of an amount of color shift and an amount of correction, and correction of color shift, which are mentioned later.

Figure 4:
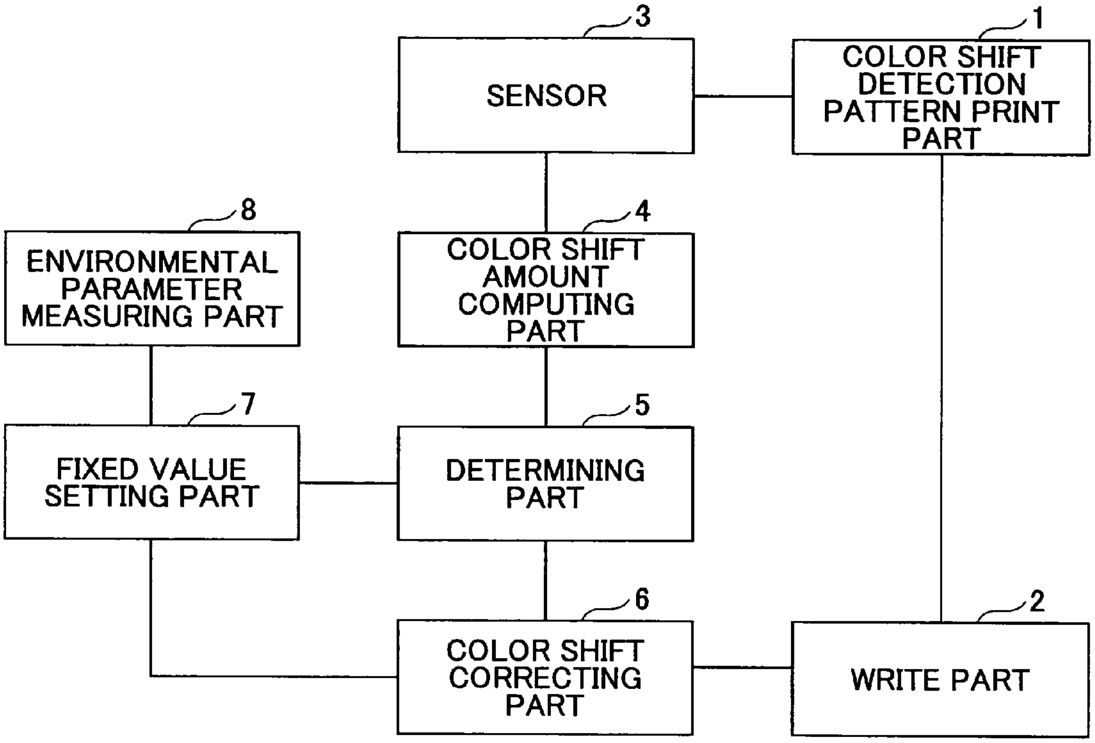
FIG. 4 is a color shift correcting apparatus according to an embodiment of the present invention.

FIG. 4 is a block diagram of a color shift correcting apparatus according to an embodiment of the present invention. The color shift correcting apparatus comprises a detection pattern printing part 1, a writing part 2, a sensor 3, a color shift amount computing part 4, a determining part 5, a color shift correcting part 6, and a fixed value setting part 7 for setting a specific fixed value to a setting value for controlling a color shift state of the color shift correcting part. The color shift correcting apparatus may further comprise an environmental parameter measuring part 8.

The color shift detection pattern printed by the color shift detection pattern printing part 1 is read by the sensor 3, and an amount of color shift is computed by the color shift amount computing part 4. The amount of color shift is determined by the determining part 5 whether it is correctable. If the amount of color shift is correctable, the color shift is corrected by the correcting part 6. If there is an abnormality found in the computed amount of color shift or in a computed amount of correction, the fixed value setting part 7 sets a fixed value to the setting value, which is provided for controlling a state of color shift of the color shift correcting part 6. The specific fixed value may be computed based on a result of measurement of the environmental parameter measuring part 8.

Figure 5:
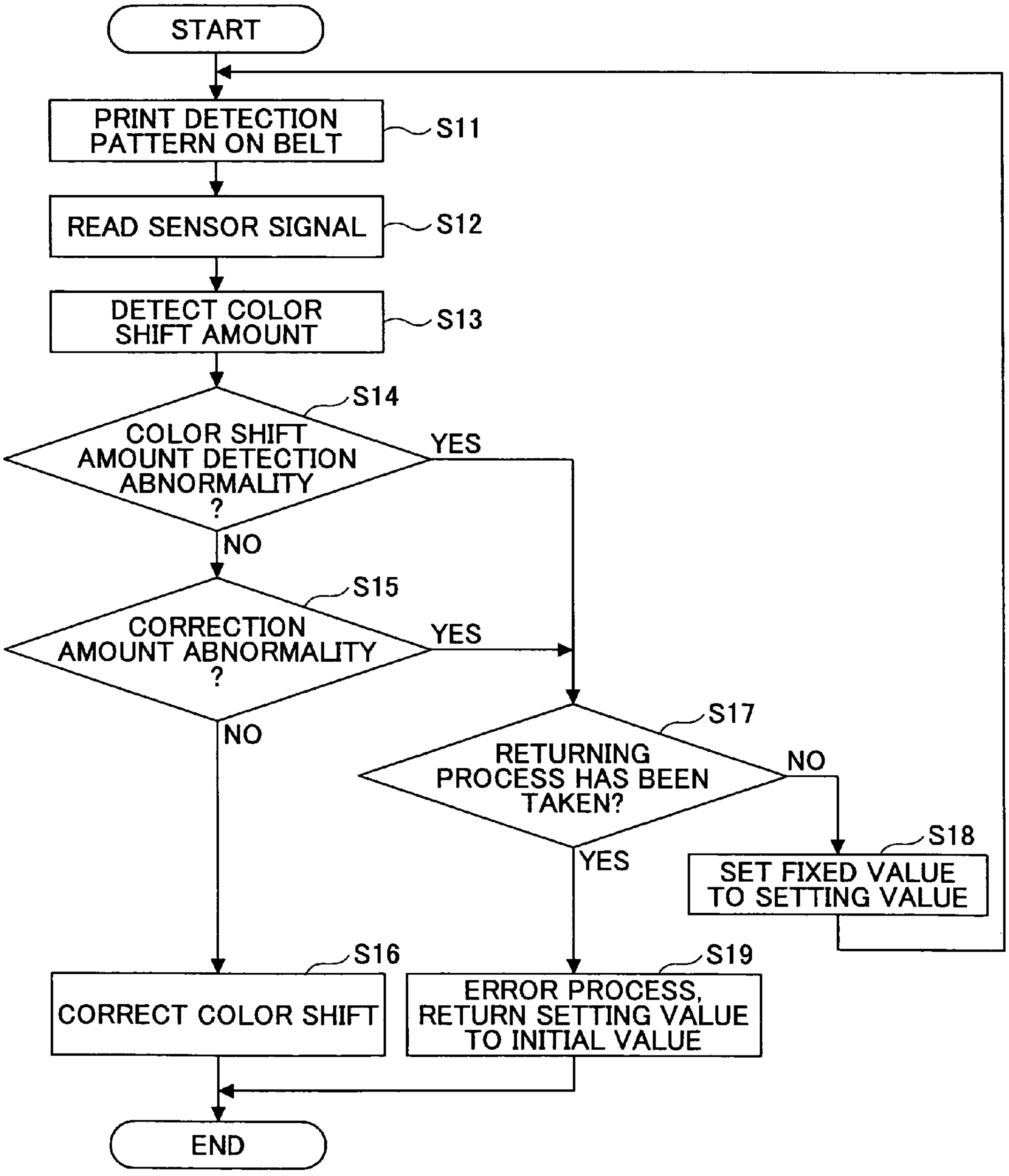
FIG. 5 is a flowchart of a color shift correction correcting process performed by the color shift correcting apparatus shown in FIG. 2.

FIG. 5 is a flowchart of a color shift correcting process performed by the color shift correcting apparatus shown in FIG. 4. In the color shift correcting process, a color shift detection pattern is printed on the belt (step S11). Then, a signal of the sensor 3 (a signal corresponding to the color shift detection pattern) is read (step S12) so as to detect an amount of color shift (step S13).

Here, there is a detectable range of a maximum amount of color shift. If the present amount of color shift is within the detectable range, color shift can be detected normally. However, if an amount of color shift is abnormally large and exceeds the detectable range, or an amount of color shift does not exceed but cannot be detected normally (for example, due to an abnormality in the pattern), such a state is rendered to. be a color shift amount detection abnormality. Additionally, if an amount of color shift exceeds a correctable range, such a state is rendered to be a correction amount abnormality.

If it is not a color shift amount detection abnormality (N of step S14), and if it is not a correction amount abnormality (N of step S15), a color shift correction is performed normally (step S16). On the other hand, if it is a color shift amount detection abnormality (Y of step S14), or if it is a correction amount abnormality (Y of step S15), the routine proceeds to step S17 where it is determined whether or not a returning process mentioned later has been taken. If no returning process has been taken (N of step S17), a specific fixed valued is set to the setting value by the fixed value setting part 7, the setting value for controlling a color shift state of the color shift correcting part 6 (step S18). Then, the routine returns to step S11 where the color shift detection pattern is formed. On the other hand, if the returning process has been taken (Y of step S19), a process of error is performed and the setting value is returned to the original initial value (step S19).

The above-mentioned returning process includes the following processes. As the specific fixed value to be set to the setting value, a value detected and used for correction when a factory adjustment is carried out can be used. Additionally, a result of adjustment performed in the individual apparatus can be used as the fixed value.

Additionally, if the color shift adjustment was performed for a plurality of times during the factory adjustment, an accuracy of the fixed value can be improved by using a mean value of the values for correction obtained in the plurality of adjustments. Further, using a mean value of the values for correction obtained from a plurality of apparatuses for a plurality of adjustments, an optimum fixed value can be set, which gives a least possibility of failure in correction of color shift.

By adding the above-mentioned returning process, it is possible to return automatically from a state where an abnormal color shift occurs. Additionally, if the returning process is not successful, the setting value is returned to an initial value, which was set at the time of factory adjustment, and, thereby, it can be avoided that the abnormal state set by the return process remains unchanged.

Although it was explained that the detectable range is fixed in the example of FIG. 3, the detection of color shift may be divided into a fine detection using a small detection range and a course detection using a large detection range. In such a case, the fine detection of color shift is performed first, and if it is not successful, then, the course detection of color shift may be performed. Then, if the course detection of color shift is not successful, the above-mentioned returning process may be taken.

Figure 6:
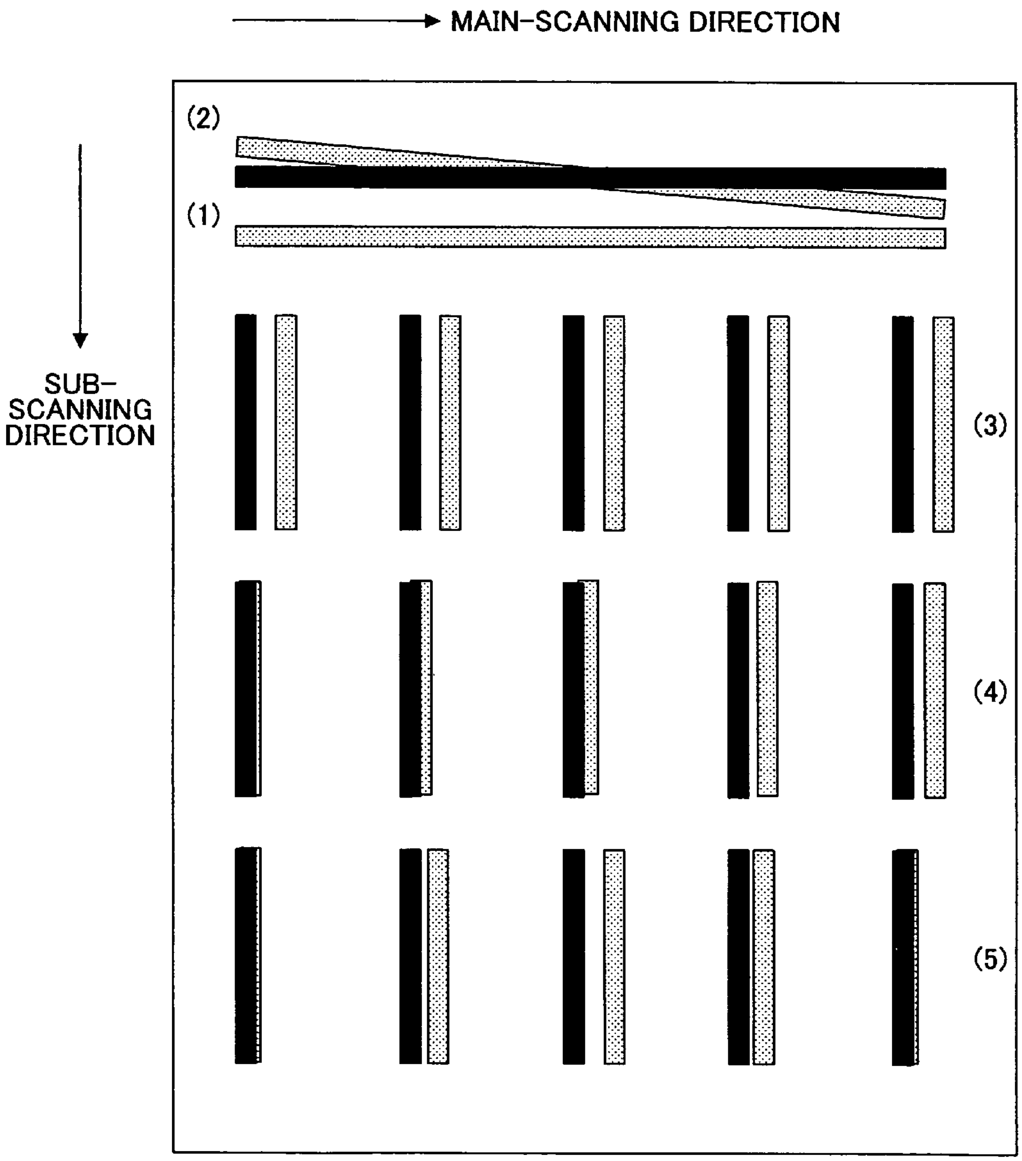
FIG. 6 is an illustration for explaining factors of color shift.
Figure 7:
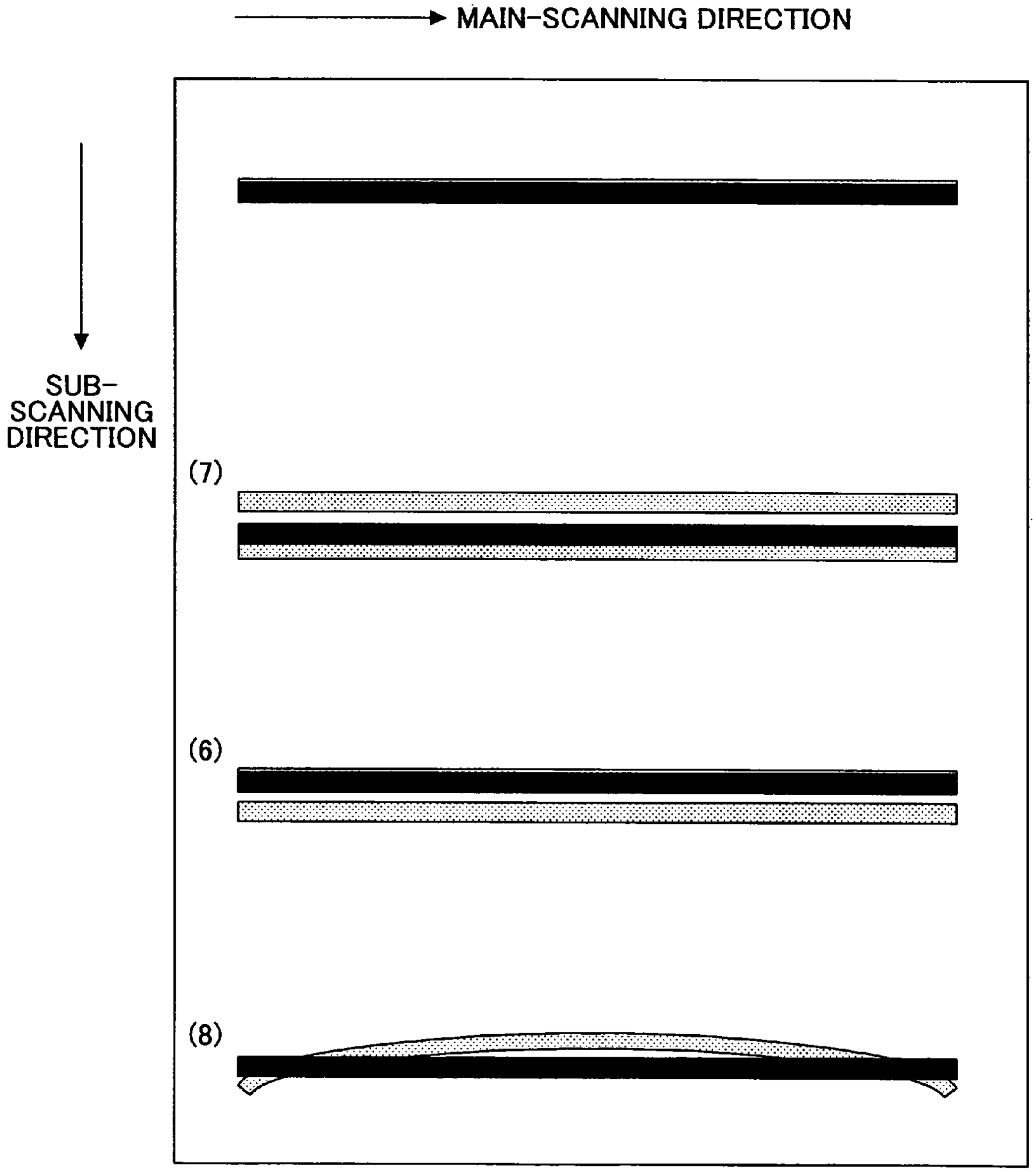
FIG. 7 is an illustration for explaining other factors of color shift.

FIGS. 6 and 7 are illustrations for explaining factors of color shift and correspondence between the factors of color shift and methods of correction of the color shift. In FIGS. 6 and 7, detection patterns are shown, in which reference bars of one color image (indicated by solid black bars) and check bars of another color image (indicated by blank bars) are provided.

FIG. 6-(1) indicates a shift of registration in a sub-scanning direction. In order to correct the shift, a write timing in the sub-scanning direction is adjusted by correcting a sub-scanning direction registration adjustment value.

FIG. 6-(2) indicates a skew shift. In order to correct the skew shift, an inclination in an optical system is adjusted by correcting a skew adjustment value.

FIG. 6-(3) indicates a shift of registration in a main-scanning direction. In order to correct the shift, a write timing in the main-scanning direction is adjusted by correcting a main-scanning direction registration adjustment value.

FIG. 6-(4) indicates a shift of magnification in a main-scanning direction. In order to correct the shift, a pixel clock is adjusted by correcting a main-magnification adjustment value.

FIG. 6-(5) indicates a shift due to an error deviation in a main magnification. In order to correct the shift, a time modulation of the pixel clock is adjusted by correcting a main-magnification error deviation adjustment value.

FIG. 7-(6) indicates a shift of magnification in a sub-scanning direction. In order to correct the shift, a conveyance belt speed is adjusted by correcting a sub-magnification adjustment value.

FIG. 7-(7) indicates a shift due to fluctuation of magnification in a sub-scanning direction. In order to correct the shift, a phase of rotation of drums is adjusted by correcting a sub-magnification error deviation adjustment value.

FIG. 7-(8) indicates a bowed shift. In order to correct the shift, a scan line is adjusted by correcting a bow shift adjustment value.

Figure 8:
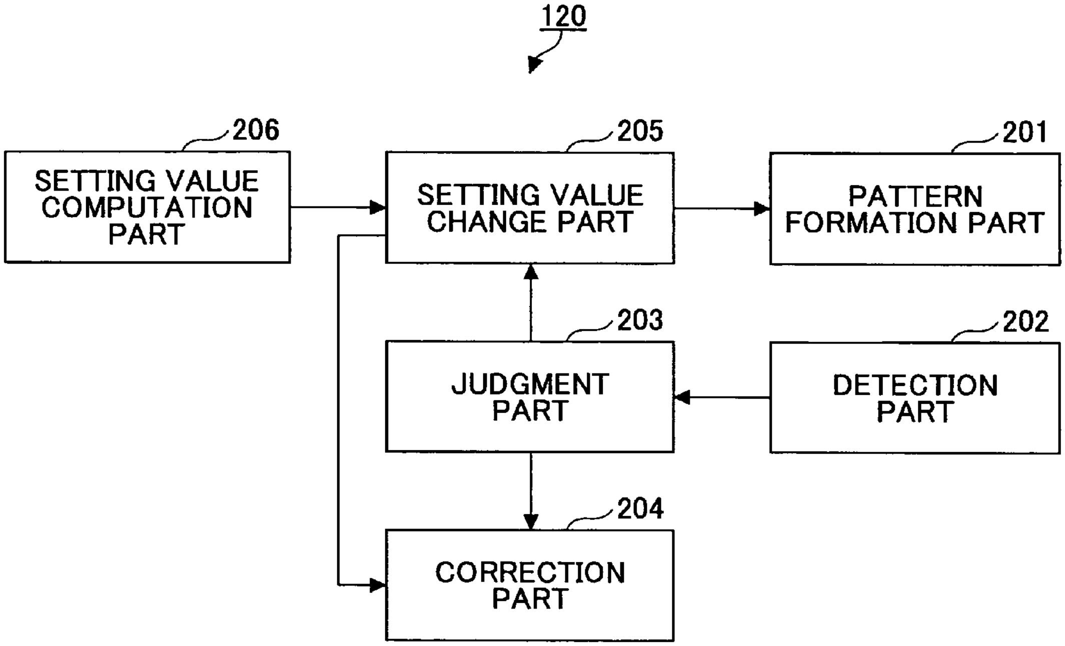
FIG. 8 is a block diagram of an electric structure of the color printer according to the embodiment of the present invention.

A description will now be given of a color shift correcting process for correcting color shift of an image formed in the color printer 100. FIG. 8 is a block diagram of an electric part of the color printer 100.

As shown in FIG. 8, the electric part of the color printer 100 comprises a pattern formation part 201, a detection part 202, a judgment part 203, a correction part 204, a setting value change part 205, and a setting value computation part 206.

The pattern formation part 201 forms each of correction patterns of a plurality of colors (for example, cyan, magenta, yellow and black) on the intermediate transfer belt 103. Specifically, a laser light is irradiated onto the surface of the photosensitive member 101 by the exposure unit (not shown in the figure) so as to form an electrostatic latent image of a correction on the surface of the photosensitive member 101. Then, a toner image is formed by causing a charged toner to adhere to the electrostatic latent image formed on the surface of the photosensitive member 101 by the development unit 102. Thereafter, the toner image is transferred onto the intermediate transfer belt 103 by an action of the primary transfer roller (not shown in the figure) so as to form the correction pattern.

When the setting value for controlling a color shift state is changed to a specific setting value by the setting value change part 205 mentioned later, the pattern formation part 201 forms the correction pattern on the intermediate transfer belt 103 based on the changed specific setting value.

The detection part 202 detects an amount of color shift of the correction pattern formed by the pattern formation part 201. Specifically, the intermediate transfer belt 103 on which a correction pattern is formed is read. Then, the detection part 202 detects an amount of color shift in the correction pattern based on a result of the read output from the sensor 107. The detectable range of an amount of color shift detectable by the detection part 202 is previously determined. Thus, the detection part 202 cannot detect accurately an amount of color shift exceeding the detectable range.

The judgment part 203 judges based on the amount of color shift detected by the detection part 20 as to whether or not it is necessary to change the setting value for controlling the color shift state of the correction pattern. Specifically, for example, the judgment part 203 may judges that it is necessary to change the setting value for controlling a color shift state in the correction pattern when an amount of color shift equal to or larger than a predetermined threshold value is detected by the detection part 202.

Moreover, the judgment part 203 may judges that it is necessary to change the setting value for controlling a color shift state in the correction pattern when an amount of color shift cannot be detected by the detection part 202. Further, the judgment part may judge that it is necessary to change the setting value for controlling a color shift state in the correction pattern when an amount of correction to be made by the correction part 204 to correct an amount of color shift detected by the detection part 202 exceeds a correctable range within which a correction can be performed by the correction part 204 mentioned later.

The correction part 204 corrects the color shift in the correction pattern formed on the intermediate transfer belt 103 by the pattern formation part 201 based on the amount of color shift detected by the detection part 202. A correctable range of an amount of correction made by the correction part 204 is previously determined. Thus, the correction part 204 cannot make a correction which exceeds the correctable range.

When it is judged by the judgment part 203 that it is necessary to change the setting value, the setting value change part 205 changes the setting value for controlling a color shift state of a correction pattern to a specific setting value. Here, the setting value for controlling a color shift state of a correction pattern is at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification error deviation adjustment value and a bow shift adjustment value.

Moreover, the specific setting value is a typical setting value in a normal state of the color printer 100. For example, the specific setting value may be a value having the same as the correction value of an immediately preceding correction made by the correction part 204 with a reverse sign. Specifically, if the correction value in the last correction is "+A", the setting value for controlling a color shift state of the correction pattern is changed to the specific setting value "−A", which has a reverse sign.

It should be noted that the correction value having a reverse sign is computed by the setting value computation part 206. Specifically, the setting value computation part 206 computes the correction value having the reverse sign based on a maximum value of each amount of color shift in the corrections of a predetermined times performed by the correction part 204.

Moreover, the specific setting value may be computed based on a setting value at a time of factory adjustment and a difference between the present measurement value and a measurement value recorded during factory adjustment of parameters indicating environmental states such as temperature, humidity or the like. Specifically, the setting value computation part 206 computes the specific setting value based on a setting value at a time of factory adjustment and a difference between the present measurement value and a measurement value recorded during factory adjustment of parameters indicating environmental states such as temperature, humidity or the like.

Figure 1:
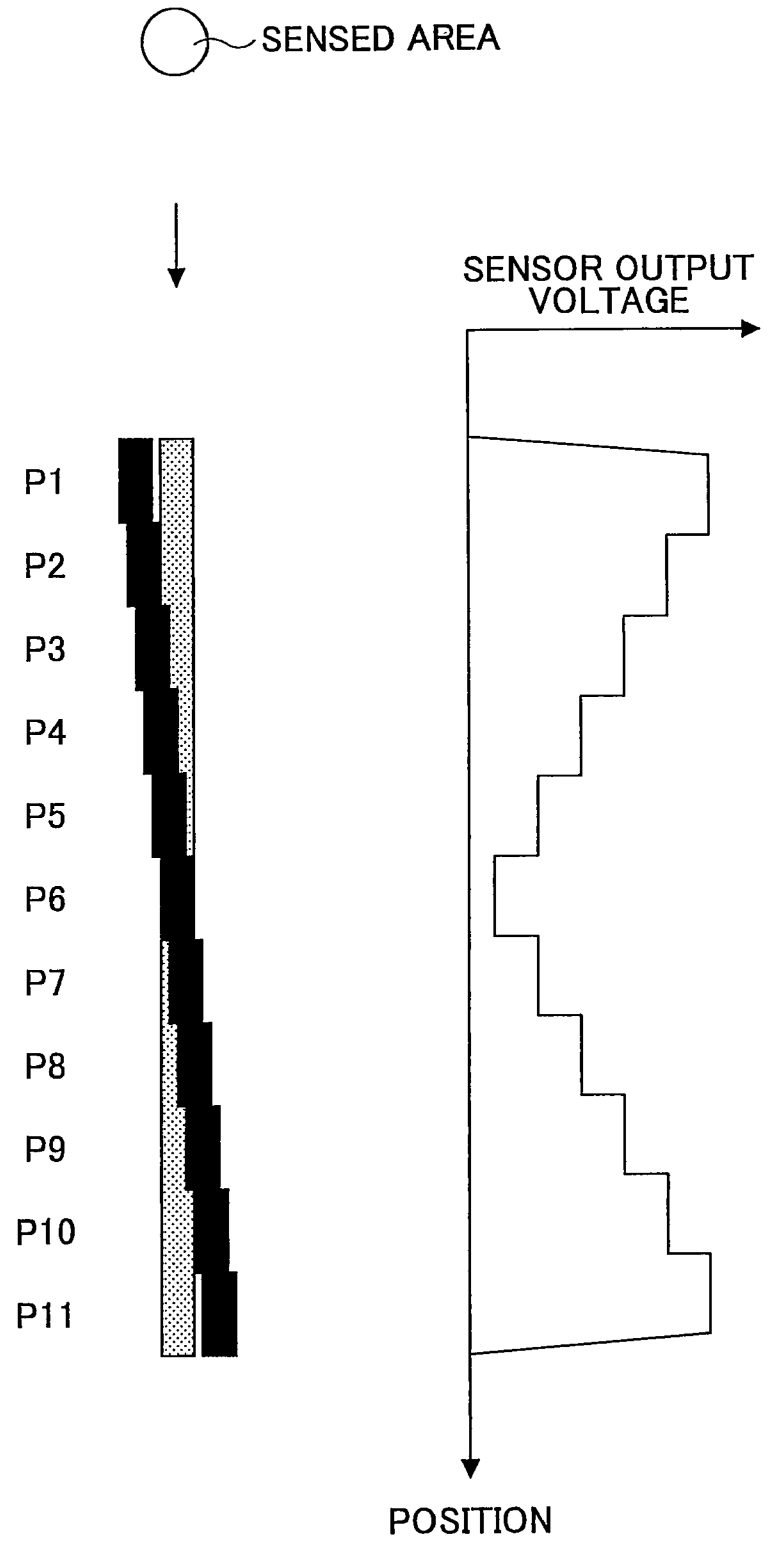
FIG.1 BACKGROUND ART
FIG. 1 is an illustration of an example of a color shift detection pattern.
Figure 2:
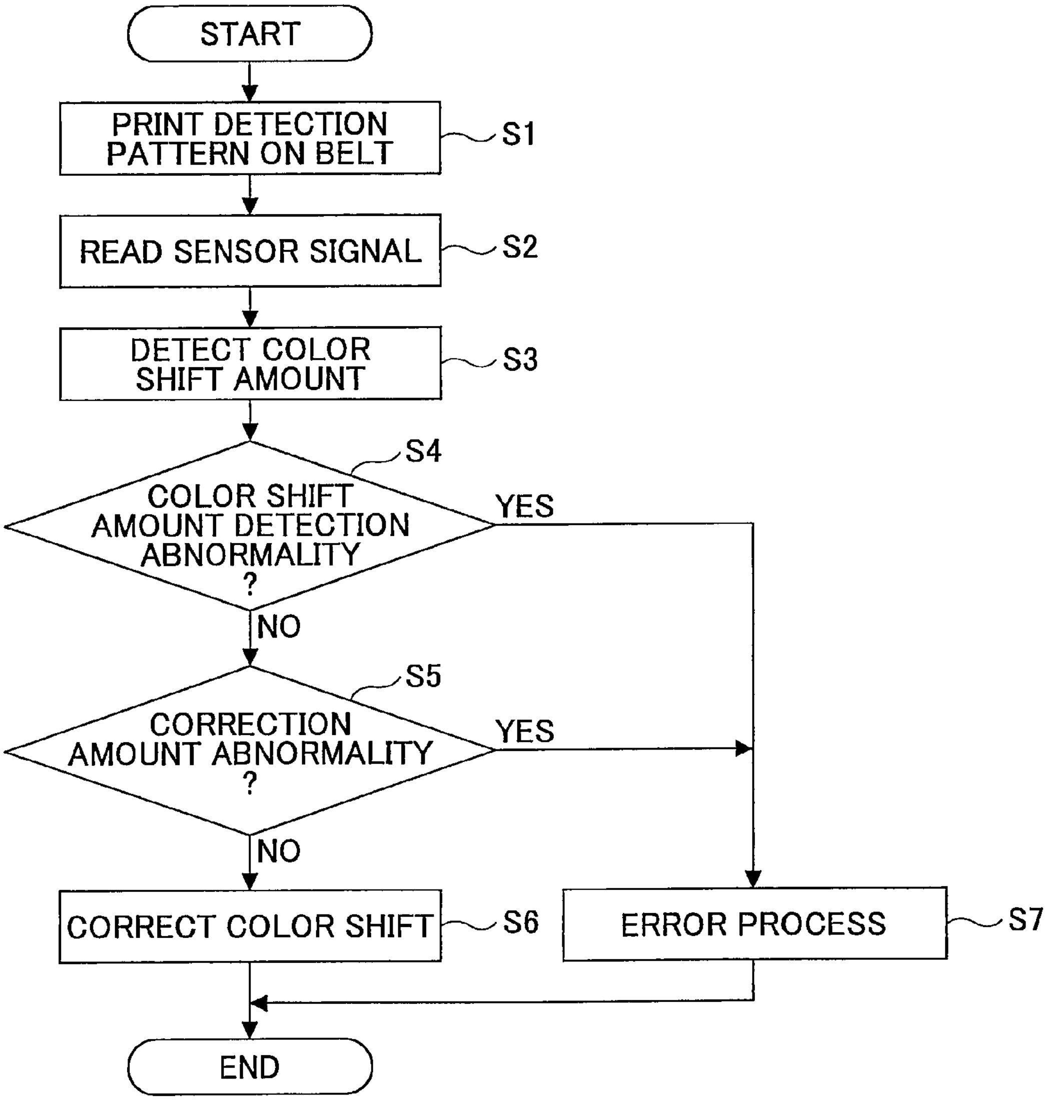
FIG.2 BACKGROUND ART
FIG. 2 is a flowchart of a conventional example of a color shift correcting process.
Figure 9:
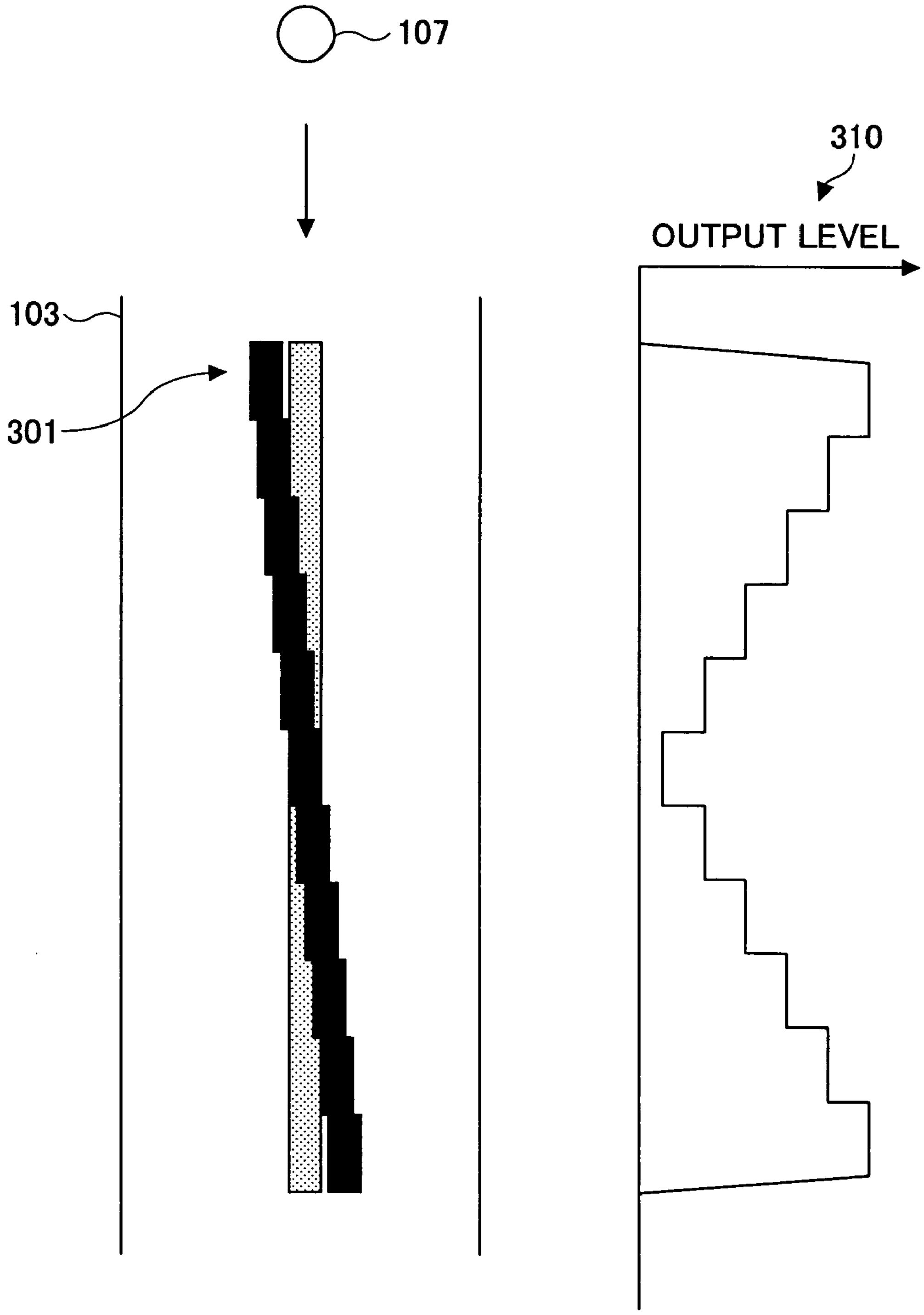
FIG. 9 is an illustration of a result of detection of amounts of color shift of a correction pattern.

A description will now be given of a detection of an amount of color shift of a correction pattern performed by the detection part 202. FIG. 9 is an illustration for explaining an example of a result of detection of an amount of color shift of a correction pattern. As shown in FIG. 9, a correction pattern 301 is formed on the intermediate transfer belt 103. The correction pattern 301formed on the intermediate transfer belt 103 is read by the sensor 107 (refer to FIG. 1).

Furthermore, shown in FIG. 9 is a graph 310 which indicates an output level output from the sensor 107 when the surface of the intermediate-transfer-belt 103 is read. The graph 310 is an output graph showing the output level corresponding to respective positions on the intermediate transfer belt 103. When detecting an amount of color shift of the correction pattern, the amount of color shift is detected using the output level shown in the graph 310. Specifically, the amount of color shift can be detected, for example, by acquiring a point at which the output level is minimized. It should be noted that the method of detecting an amount of color shift of a correction pattern is not limited to the above-mentioned method, and any method can be used if an amount of color shift is detected accurately.

Figure 10:
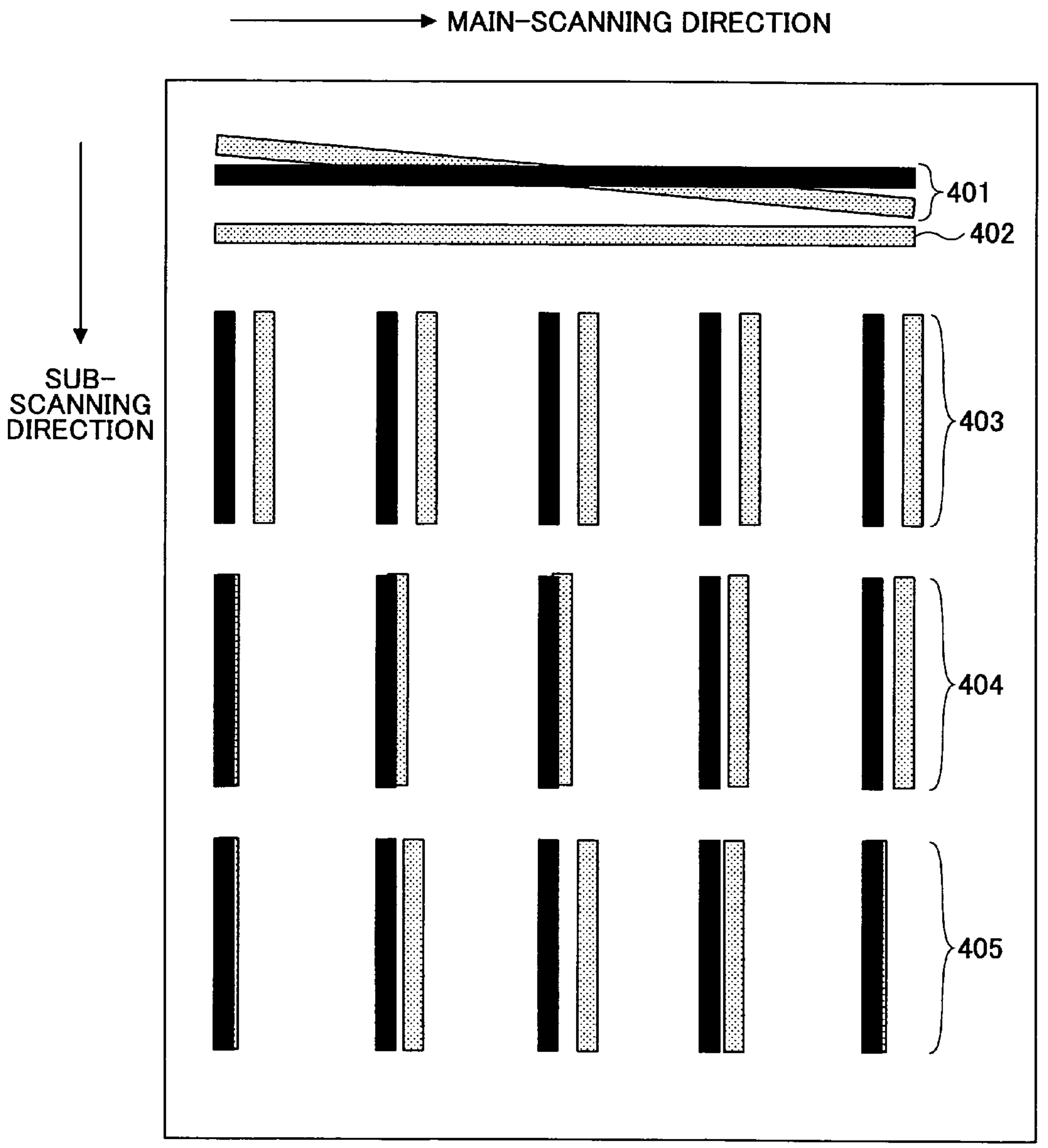
FIG. 10 is an illustration for explaining an example of color shift of a correction pattern.
Figure 11:
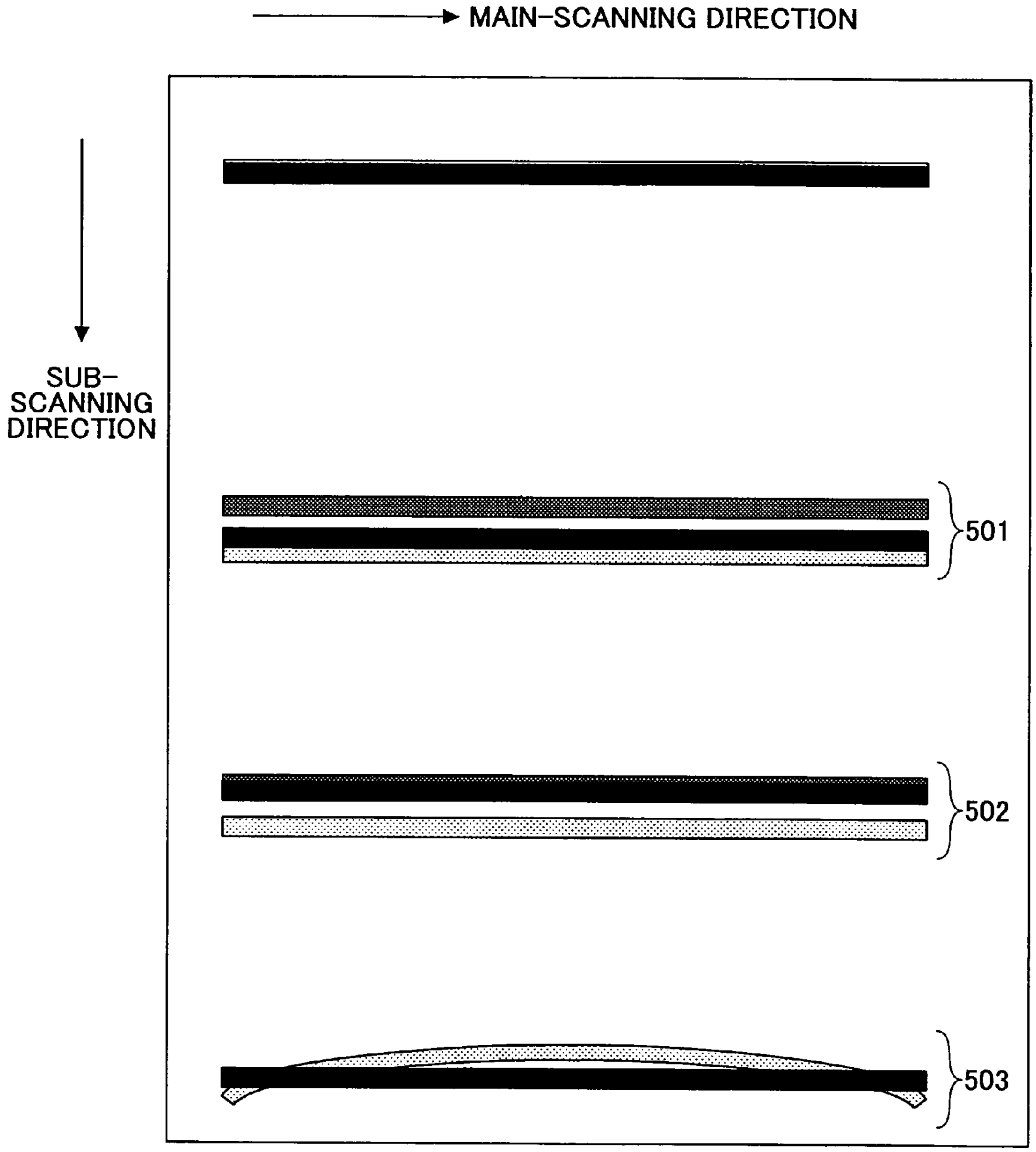
FIG. 11 is an illustration for explaining another example of color shift of a correction pattern.

A description will now be given below, with reference to FIG. 10 and FIG. 11, of a color-shift state of a correction pattern. FIG. 10 is an illustration for explaining an example of color shift in a correction pattern. FIG. 11 is an illustration for explaining another example of color shift in a correction pattern. First, a description will be given of a color shift in the correction pattern shown in FIG. 10. There are shown in FIG. 10 a color shift factor 401 indicating a skew shift in which a registration is inclined with respect to a previously set reference line, a color shift factor 402 indicating a shift of registration in the sub-scanning direction, a color shift factor 403 indicating a shift of registration in the main-scanning direction, a color shift factor 404 indicating a shift in a magnification in the main-scanning direction, and a color shift factor 405 indicating an error deviation in the magnification in the main-scanning direction.

As an example of a method for correcting each of the color shift factors, there are following methods. The color shift factor 401 can be corrected by adjusting an inclination of an optical system such as a mirror for guiding a light irradiated from an exposure unit, for example, to the surface of the photosensitive member 101. The color shift factors 402 and 403 can be corrected, as an electrical correction, by adjusting a timing when irradiating a light onto the photosensitive member 101 by the exposure unit (not shown in the figure).

The color shift factor 404 can be corrected by performing a pixel clock adjustment for adjusting signal synchronization at a time of input or output of correction pattern data. The color shift factor 405 can be corrected by adjusting a pixel clock time.

Next, there are shown in FIG. 11 a color shift factor 501 indicating a shift generated by a fluctuation in a magnification in the sub-scanning direction, a color shift factor 502 indicating a shift generated by a fluctuation in a magnification in the main-scanning direction, and a color shift factor 503 indicating a bow shift in which registration is bowed with respect to a previously set reference line.

As an example of a method of correcting each of the color shift factors, there are the following method. The color shift factor 501 can be corrected by adjusting a phase shift of each of the photosensitive members 101*a* through 101*d*. The color shift factor 502 can be corrected by adjusting a rotation speed of the intermediate transfer belt 103. The color shift factor 503 can be corrected by performing adjustment by changing a line (which is parallel to the main-scanning direction) when irradiating a light onto the surface of the photosensitive member 101 by the exposure unit.

Figure 12:
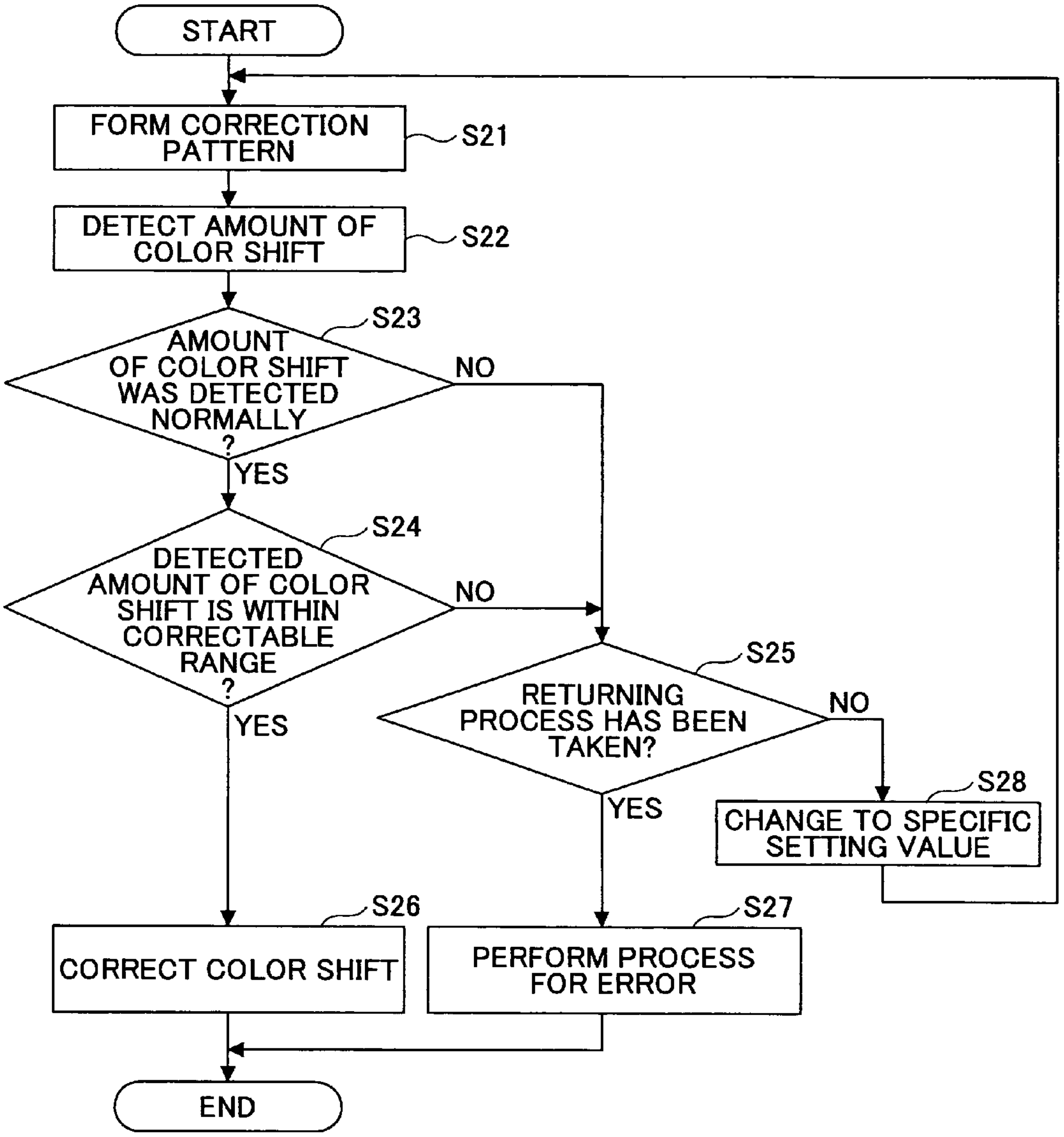
FIG. 12 is a flowchart of a color shift correcting process of the color printer according to the embodiment of the present invention.

A description will now be given of a color shift correcting process performed in the color printer 100. FIG. 12 is a flowchart of a color shift correcting process performed in the color printer 100. In the flowchart of FIG. 12, the pattern formation part 201 of the color printer 100 forms a correction pattern of each of a plurality of colors on the intermediate transfer belt 103 so as to perform a correction of color shift in an image (step S21).

Then, the detection part 202 detects an amount of color shift of the correction pattern formed by the pattern formation part 201 (step S22). Specifically, for example, an amount of color shift of the correction pattern is detected according to the detection method explained with reference to FIG. 9.

Next, the judgment part 203 judges whether or not an amount of color shift has been detected normally by the detection part 202 (step S23). Specifically, the judgment part 203 judges whether an amount of color shift equal to or greater than a threshold value has been detected by the detection part 202 or an amount of color shift cannot be detected by the detection part.

Here, if an amount of color shift has been detected normally (Yes of step S23), the judgment part 203 judges whether or not the detected amount of color shift is within a correctable range (step S24). Specifically, the judgment part 203 judges whether or not the correction to be made for the amount of color shift detected by the detection part 202 exceeds a correctable range in which a correction can be made by the correction part 204.

On the other hand, if an amount of color shift cannot be detected normally (No of step S23), or if the detected amount of color shift detected in step S24 is out of the correctable range (No of step S24), the judgment part 203 judges whether or not a returning process has been taken (step S25).

Here, the returning process is a process for returning to a state where an amount of color shift can be detected normally be the detection part 202 or returning to a state where a correction can be made to the detected amount of color shift. Specifically, the returning process is a process performed in step 26 mentioned later.

If it is judged that the returning process has not been taken (No of step S25), the judgment part 203 judges that it is necessary to change the setting value for controlling a color shift state of a correction pattern. Thus, the setting value change part 205 changes the setting value for controlling a color shift state of a correction pattern to the specific setting value (step S26), and the routine returns to step S21.

Here, when the routine returns from step S26 to step S21, the pattern formation part 201 newly forms a correction pattern on the intermediate transfer belt 103 based on the specific setting value changed in step S26. Then, the detection part 202 detects again an amount of color shift of the correction pattern formed by the pattern formation part 201.

Then, the judgment part 203 performs judgments of steps S23 and S24 based on a result of the detection by the detection part 202. That is, if an amount of color shift cannot be detected normally or an amount of color shift cannot be corrected normally since the amount of color shift as a result of detection in step S22 is too large, the returning process is performed to correct the amount of color shift to a value at which an amount of color shift can be detected normally in step S26, and, thereafter, the routine returns to step S21 to repeat the series of steps.

On the other hand, if it is determined that the returning process has been taken (Yes of step S25), the color printer 100 performs an error process (step S27), and the series of steps in the flowchart is ended.

Here, the case where it is determined that the returning process has been taken is a case where an amount of color shift cannot be detected normally in step S23 even if the setting value for controlling a color shift state of a correction pattern was changed in step S26, or a case where an amount of color shift detected in step S24 is within the correctable range. It should be noted that if the error process is performed in step S27, the setting value changed in step S26 may be returned to the original setting value so as to return to a state before the returning process was performed.

On the other hand, if the amount of color shift detected in step S24 is within the correctable range (Yes of step S24), the correction part 204 corrects the color shift of the correction pattern formed on the intermediate transfer belt 103 by the pattern formation part 201 based on the amount of color shifts detected by the detection part 202 (step S28), and the routine of the series of steps according to the flowchart is ended.

Specifically, for example, using the methods of correcting the above-mentioned color shift factors, a correction is performed with respect to a main-scanning direction registration, a sub-scanning direction registration, a skew, a main magnification, a sub-magnification, a main-magnification error deviation, a sub-magnification fluctuation or a bow shift.

It should be noted that although the description was given of the case where the detectable range when detecting an amount of color shift is fixed in the color printer 100, which is an image forming apparatus according to the present embodiment, it may be configured and arranged to perform the correction of color shift by detecting an amount of color shift according to the following procedures.

For example, a fine adjustment detection and correction is made first using a narrow detectable range, and if an amount of color shift cannot be corrected normally, a coarse adjustment detection and correction is performed after expanding the detectable range of an amount of color shift. Additionally, the coarse adjustment detection and correction may be performed first, and if an amount of color shift is not corrected normally, then, the fine adjustment detection and correction is performed.

As mentioned above, according to the color printer according to the present embodiment, when detecting an amount of color shift of a correction pattern to correct color shift in an image, if an amount of color shift exceeds a detectable range, or if the detected amount of color shift exceeds a correctable range, the setting value for controlling a color shift state is automatically changed so that it is returned to a detectable or correctable amount of color shift.

Thereby, according to the color printer 100, since an amount of a correction pattern is large, even if a case where an amount of color shift cannot be detected normally or a case where a correction to the detected amount of color shift cannot be performed, the amount of color shift can be corrected automatically to a normal value. Further, according to the color printer 100, since the correction of color shift is performed by detecting again a corrected amount of color shift, an accurate correction of color shift can be performed.

Moreover, according to the color printer 100, since the setting value to be changed is computed in consideration of a change in an environment from a time of a factory adjustment, the setting value for controlling a color shift state can be changed to an appropriate setting value, which enables improvement in a probability of returning to a state in which an amount of color shift can be detected.

Additionally, the setting value for controlling a color shift state of a correction pattern is at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification fluctuation adjustment value and a bow shift adjustment value.

Thus, according to the color printer 100, a return from a state, in which at least one of a main-scanning direction registration, a sub-scanning direction registration, a skew, a main-magnification, a sub-magnification, a main-magnification error deviation, a sub-magnification fluctuation and a bow shift is abnormal, can be made by changing the setting value.

It should be noted that the correcting method explained in the present embodiment can be achieved by a computer such as a personal computer or a work station executing a previously prepared program. Such a program is recorded on a computer readable recording medium such as a hard disk, a flexible disk, a CD-ROM, a MO or a DVD, and is executed by being read from the recording medium by a computer. Such a program may be a transmissible medium which can be distributed through a network such as the Internet.

The present invention is not limited to the specifically disclosed embodiments, and variations and modifications may be made without departing from the scope of the present invention.

The present application is based on Japanese priority applications No. 2005-259772 filed Sep. 7, 2005 and No. 2006-210408 filed Aug. 1, 2006, the entire contents of which are hereby incorporated herein by reference.

What is claimed is:

1. A color shift correcting apparatus, comprising:

a color shift detection pattern forming part that forms a color shift detection pattern;

a sensor that detects color shift in the color shift detection pattern;

a color shift amount computing part that calculates an amount of color shift;

a color shift correcting part that corrects the calculated amount of color shift;

a correction amount computing part that computes an amount of correction to correct the computed amount of color shift;

a correcting part that corrects the computed amount of color shift based on the computed amount of correction based on a setting value for controlling a color shift state;

a determining part that determines whether an abnormality is detected in the computed amount of color shift or in the computed amount of correction of color shift based on a result of computation of the amount of color shift or a result of computation of the amount of correction;

a fixed value setting part that sets a specific fixed value to the setting value of said correcting part; and a control part that detects color shift again by using said specific fixed value after the abnormality is detected, and returns said setting value to an initial setting value when an occurrence of the abnormality is detected by said determining part again.

2. The color shift correcting apparatus as claimed in claim 1, wherein said fixed value is a correction value previously obtained at a time of adjustment in manufacturing.

3. The color shift correcting apparatus as claimed in claim 1, wherein said fixed value is a statistical mean value of correction values obtained at a time of adjustment in manufacturing.

4. The color shift correcting apparatus as claimed in claim 1, wherein said fixed value is a statistical mean value of correction values obtained from a plurality of apparatuses at a time of adjustment in manufacturing.

5. The color shift correcting apparatus as claimed in claim 1, wherein said fixed value is changed by a setting operation through an operation part of the color shift correcting apparatus.

6. The color shift correcting apparatus as claimed in claim 1, wherein said setting value is at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification error deviation adjustment value and a bow shift adjustment value.

7. A color shift correcting method, comprising:

reading a color detection pattern;

computing an amount of color shift based on a result of the reading of the color detection pattern;

determining whether the computed amount of color shift is correctable;

correcting the color shift when the computed amount of color shift is correctable;

setting a specific fixed value to a setting value for controlling a color shift state when the computed amount of color shift is not correctable; and computing, an amount of color shift again by using said specific fixed value when the computed amount of color shift is not correctable, and returning the setting value to an initial setting value when the computed amount of color shift is determined to be not correctable again.

8. The color shift correcting method as claimed in claim 7, wherein the determination of correctability includes detection of an abnormality in an amount of color shift or an abnormality in an amount of correction.

9. An image forming apparatus, comprising:

a pattern formation part that forms a correction pattern of each of a plurality of colors on a transfer belt so as to correct color shift in an image;

a detection part that detects an amount of color shift in the correction pattern formed by said pattern formation part;

a judgment part that judges whether or not a setting value for controlling a color shift state of said correction pattern is needed to be changed based on the amount of color shift detected by said detection part;

a setting value change part that changes, when said judgment part judges that a change is needed, the setting value for controlling a color shift state of the correction pattern when forming the correction pattern by said pattern formation part to a specific setting value; and a control part that detects an amount of color shift again using the specific setting value when the judgment part judges that the change is needed, and returns the setting value to an initial setting value when the judgment part again judges that a change is needed.

10. The image forming apparatus as claimed in claim 9, wherein when said detection part detects an amount of color shift equal to or greater than a predetermined threshold value, said judgment part judges that the setting value for controlling a color shift of the correction pattern is needed to be changed.

11. The image forming apparatus as claimed in claim 9, wherein when said detection part does not detect an amount of color shift, said judgment part judges that the setting value for controlling a color shift of the correction pattern is needed to be changed.

12. The image forming apparatus as claimed in claim 9, further comprising a correction part that corrects a color shift in the correction pattern formed by said pattern formation part based on an amount of the color shift detected by said detection part, and wherein when the setting value for controlling a color state was changed to the specific setting value by said setting value change part, said pattern formation part forms a correction pattern on said transfer belt, based on said specific setting value.

13. The image forming apparatus as claimed in claim 12, wherein when a correction to an amount of color shift detected by said detection part exceeds a correctable range in which the correction can be performed by said correction part, said judgment part judges that the setting value for controlling a color shift state of the correction pattern in needed to be changed.

14. The image forming apparatus as claimed in claim 13, wherein said specific setting value is a value having the same absolute value as a correction value in an immediately preceding correction with a plus-minus sign reversed from that of the correction value.

15. The image forming apparatus as claimed in claim 12, wherein said specific setting value is computed based on an absolute value of a maximum amount of color shift in a correction performed by said correction part for a plurality of times and having a plus-minus sign reversed from that of the maximum amount of color shift.

16. The image forming apparatus as claimed in claim 9, wherein said specific setting value is computed based on a setting value at a time of factory adjustment and a difference between present measurement values and measurement values of parameters indicating a state of an environment including a temperature and humidity.

17. The image forming apparatus as claimed in claim 9, wherein the setting value for controlling a color shift state of the correction pattern is at least one of a main-scanning direction registration adjustment value, a sub-scanning direction registration adjustment value, a skew adjustment value, a main-magnification adjustment value, a sub-magnification adjustment value, a main-magnification error deviation adjustment value, a sub-magnification fluctuation adjustment value and a bow shift adjustment value.

18. A color shift correcting method, comprising:

a first pattern forming step of forming a correction pattern of each of a plurality of colors on a transfer belt so as to correct color shift in an image;

a first detecting step of detecting an amount of color shift in the correction pattern formed by said pattern forming step;

a judging step of judging whether or not a setting value for controlling a color shift state of said correction pattern is needed to be changed based on the amount of color shift detected by said detecting step;

a setting value changing step of changing, when said judging step part judges that a change is needed, the setting value for controlling a color shift state of the correction pattern when forming the correction pattern by said first pattern forming step to a specific setting value;

a second pattern forming step of forming another correction pattern on said transfer belt based on said specific setting value when the setting value for controlling a color shift state has been changed by said setting value changing step;

a second detecting step of detecting an amount of color shift in said another correction pattern formed by said second pattern forming step;

a correcting step of correcting the color shift in said another correction pattern formed by said second pattern forming step based on the amount of color shift detected by said second detecting step; and a control step that returns the setting value to an initial setting value when it is judged that, based on the amount of color shift detected in the second detecting step, a change is needed in the setting value.

19. A computer readable recording medium storing a program for causing a computer to perform a color shift correcting method, the method comprising:

a first pattern forming step of forming a correction pattern of each of a plurality of colors on a transfer belt so as to correct color shift in an image;

a first detecting step of detecting an amount of color shift in the correction pattern formed by said pattern forming step;

a judging step of judging whether or not a setting value for controlling a color shift state of said correction pattern is needed to be changed based on the amount of color shift detected by said detecting step;

a setting value changing step of changing, when said judging step part judges that a change is needed, the setting value for controlling a color shift state of the correction pattern when forming the correction pattern by said first pattern forming step to a specific setting value;

a second pattern forming step of forming another correction pattern on said transfer belt based on said specific setting value when the setting value for controlling a color shift state has been changed by said setting value changing step;

a second detecting step of detecting an amount of color shift in said another correction pattern formed by said second pattern forming step; and a correcting step of correcting the color shift in said another correction pattern formed by said second pattern forming step based on the amount of color shift detected by said second detecting step; and a control step that returns the setting value to an initial setting value when it is judged that, based on the amount of color shift detected in the second detecting step, a change is needed in the setting value.

* * * * *